United States Patent
Giolando

(10) Patent No.: US 8,574,944 B2
(45) Date of Patent: Nov. 5, 2013

(54) SYSTEM FOR SELECTIVELY FILLING PIN HOLES, WEAK SHUNTS AND/OR SCRIBE LINES IN PHOTOVOLTAIC DEVICES AND PHOTOVOLTAIC CELLS MADE THEREBY

(75) Inventor: Dean M. Giolando, Toledo, OH (US)

(73) Assignee: The University of Toledo, Toledo, OH (US)

( * ) Notice: Subject to any disclaimer, the term of this patent is extended or adjusted under 35 U.S.C. 154(b) by 353 days.

(21) Appl. No.: 12/921,641

(22) PCT Filed: Mar. 27, 2009

(86) PCT No.: PCT/US2009/038586
§ 371 (c)(1),
(2), (4) Date: Oct. 6, 2010

(87) PCT Pub. No.: WO2009/120974
PCT Pub. Date: Oct. 1, 2009

(65) Prior Publication Data
US 2011/0214729 A1    Sep. 8, 2011

Related U.S. Application Data

(60) Provisional application No. 61/072,258, filed on Mar. 28, 2008.

(51) Int. Cl.
*H01L 21/00*    (2006.01)
(52) U.S. Cl.
USPC .................. 438/57; 438/98; 257/E25.009
(58) Field of Classification Search
USPC .............. 438/57–66, 95–99; 136/249–256
See application file for complete search history.

(56) References Cited

U.S. PATENT DOCUMENTS

| | | | |
|---|---|---|---|
| 4,166,918 | A | 9/1979 | Nostrand et al. |
| 4,251,286 | A | 2/1981 | Barnett |
| 4,316,049 | A | 2/1982 | Hanak |
| 4,335,266 | A | 6/1982 | Mickelsen et al. |
| 4,385,971 | A | 5/1983 | Swartz |
| 4,419,530 | A | 12/1983 | Nath |
| 4,420,497 | A | 12/1983 | Tickle |
| 4,451,970 | A | 6/1984 | Izu et al. |
| 4,464,823 | A | 8/1984 | Izu et al. |
| 4,510,674 | A | 4/1985 | Izu et al. |
| 4,510,675 | A | 4/1985 | Izu et al. |
| 4,598,306 | A | 7/1986 | Nath et al. |

(Continued)

FOREIGN PATENT DOCUMENTS

| | | |
|---|---|---|
| JP | 60085576 A | 5/1985 |
| WO | 2005101510 A2 | 10/2005 |

(Continued)

OTHER PUBLICATIONS

Roussillon, Y. et al., "Blocking Thin-Film Nonuniformities: Photovoltaic Self-Healing," Applied Physics Letters, Jan. 2004, vol. 84, Issue 4.*

(Continued)

*Primary Examiner* — Brook Kebede
(74) *Attorney, Agent, or Firm* — MacMillan, Sobanski & Todd, LLC

(57) ABSTRACT

A system for selectively filling pin holes, weak shunts and/or scribe lines in photovoltaics devices and photovoltaic cells made thereby is described.

17 Claims, 1 Drawing Sheet

(56) References Cited

U.S. PATENT DOCUMENTS

| | | | |
|---|---|---|---|
| 4,725,558 A * | 2/1988 | Yamazaki et al. | 438/80 |
| 4,729,970 A | 3/1988 | Nath et al. | |
| 5,055,416 A | 10/1991 | Weber | |
| 5,084,400 A | 1/1992 | Nath et al. | |
| 5,320,723 A | 6/1994 | Kawakami | |
| 5,431,800 A | 7/1995 | Kirchhoff et al. | |
| 5,800,632 A | 9/1998 | Arao et al. | |
| 5,837,395 A | 11/1998 | Breault et al. | |
| 5,859,397 A | 1/1999 | Ichinose et al. | |
| 6,132,585 A | 10/2000 | Midorikawa et al. | |
| 6,221,685 B1 | 4/2001 | Ichinose et al. | |
| 6,265,653 B1 * | 7/2001 | Haigh et al. | 136/249 |
| 6,416,814 B1 | 7/2002 | Giolando | |
| 6,521,823 B2 * | 2/2003 | Kubota et al. | 136/246 |
| 6,613,973 B2 | 9/2003 | Mukai et al. | |
| 6,627,765 B2 | 9/2003 | Giolando | |
| 6,670,705 B1 | 12/2003 | Harris et al. | |
| 6,852,614 B1 | 2/2005 | Compaan et al. | |
| 6,924,046 B2 | 8/2005 | Stamm | |
| 7,008,481 B2 | 3/2006 | Giolando et al. | |
| 7,019,513 B1 | 3/2006 | Faifer et al. | |
| 7,052,587 B2 | 5/2006 | Gibson et al. | |
| 7,094,441 B2 | 8/2006 | Chittibabu et al. | |
| 7,098,058 B1 | 8/2006 | Karpov et al. | |
| 7,214,475 B2 | 5/2007 | Erben et al. | |
| 7,256,140 B2 | 8/2007 | Call et al. | |
| 7,485,474 B2 | 2/2009 | Call et al. | |
| 2001/0054436 A1 | 12/2001 | Mukai et al. | |
| 2003/0189213 A1 * | 10/2003 | Igaki et al. | 257/81 |
| 2005/0194035 A1 | 9/2005 | Jin et al. | |
| 2005/0214479 A1 | 9/2005 | Erben et al. | |
| 2006/0174934 A1 | 8/2006 | Sager et al. | |
| 2006/0249202 A1 | 11/2006 | Yoo et al. | |
| 2007/0065992 A1 | 3/2007 | Call et al. | |
| 2007/0227586 A1 | 10/2007 | Zapalac, Jr. | |
| 2007/0256729 A1 | 11/2007 | Vijh et al. | |
| 2009/0246907 A1 | 10/2009 | DeMaggio et al. | |
| 2010/0304512 A1 | 12/2010 | Karpov et al. | |

FOREIGN PATENT DOCUMENTS

| | | | |
|---|---|---|---|
| WO | 2007035200 A3 | 3/2007 | |
| WO | 2009120974 A2 | 6/2009 | |
| WO | 2009073501 A3 | 10/2009 | |

OTHER PUBLICATIONS

PCT International Search Report and The Written Opinion, PCT/US05/12777 filed Apr. 15, 2005, Publ. Oct. 27, 2005, WO2005/01510.

PCT International Search Report and The Written Opinion, PCT/US08/84813 filed Nov. 26, 2008, Publ. Jul. 23, 2009, WO/2009/073501.

PCT International Search Report and The Written Opinion, PCT/US09/38586 filed Mar. 27, 2009, dated Dec. 24, 2009, WO/2009/20974.

PCT International Preliminary Report on Patentability, PCT/US09/38586 filed Mar. 27, 2009, dated Oct. 7, 2010, WO/2009/20974.

PCT International Search Report, PCT/US2006/28931 filed Jul. 26, 2006, dated May 10, 2007, WO/2007/035200.

Abouatallah, R. M. et al.,"Impedance Study of Nickel Cathode Reactivation by Vanadium during Hydrogen Evolution in Alkaline Water," Electrochemical and Solid-State Letters, 2002, pp. E9-E12, vol. 5, No. 3.

Bak, T. et al., "Photo-Electrochemical Hydrogen Generation from Water Using Solar Energy, Materials-Related Aspects," International Journal of Hydrogen Energy, 2002, pp. 991-1022, vol. 27.

Bennett, M. et al., "An Investigation of the Effect and Nature of Shunts in a-Si Solar Cells," Proc. 23rd IEEE PVSC, 1993, Louisville, KY.

Czanderna, A. W. et al., "Encapsulation of PV Modules Using Ethylene Vinyl Acetate Copolymer as a Pottant: A Critical Review," Solar Energy Materials & Solar Cells, 1996, pp. 101-181, vol. 43.

Deng, X. et al., "Ultra-Lightweight Amorphous Silicon Solar Cells Deposited on 7.5mm Thick Stainless Steel Substrates," Proc. 28th IEEE PVSC, 2000, p. 1050, Anchorage, Alaska.

Ichikawa, Y. et al., "Production Technology for Amorphous Silicon-Based Flexible Solar Cells," Solar Energy Materials & Solar Cells, 2001, pp. 107-115, vol. 66.

Ikeo, I. et al., "Fabricaiton and Properties of Flexible a-Si:H Solar Cells with Textured Al-Si Alloy Electrodes," Jounal of Non Crystalline Solids, 1996, pp. 198-200.

Kagan, M. et al., "Space Qualification of Amorphous Silicon Alloy Light-Weight Modules," 28th IEEE PVSC, 2000, pp. 1261-1264.

Karpov, P. V. et al., "The Mesoscale Physics of Large-Area Photovoltaics," Proceedings of 3rd World Conference on Photovoltaic Energy Conversion, Osaka, Japan, May 11-18, 2003.

Karpov, P. V. et al., "Micrononuniformity Effects in Thin-Film Photovoltaics," Proceedings of 29th IEEE Photovoltaic Specialists Conference, New Orelans, May 18-23, 2002, pp. 708-711.

Karpov, P. V. et al., "Non-Uniform Power Generation in Polycrystalline Thin-Film Photovoltaics," Proceedings of 27th IEEE Photovoltaic Specialists Conference, Alaska, 2000, pp. 547-550.

Kuendig, J. et al., "Thin-Film Silicon Solar Cells for Space Applications: Radiation Hardness and Applications for an Integrated Solant (Solar Cell-Antenna) Module," 28th IEEE PVSC, Sep. 2000, Anchorage, Alaska.

Nath, P. et al., "Conversion Process for Passivating Current Shunting Paths in Amorphous Silicon Alloy Solar Cells," Appl. Phys. Lett., Sep. 1988, vol. 53, No. 11.

Nishiwaki, H. et al., "Development of an Ultralight Flexible a-Si Solar Cell Submodule," Solar Energy Materials and Solar Cells, 1995, pp. 295-306, vol. 37.

Reddy, M. R., "Space Solar Cells—Tradeoff Analysis," Solar Energy Materials & Solar Cells, 2003, pp. 175-208, vol. 77.

Pern, F. J. et al., "Photothermal Stability of Encapsulated Si Solar Cells and Encapsulation Materials Upon Accerlerated Exposures," Solar Energy Materials & Solar Cells, 2000, pp. 153-188, vol. 61.

Shvydka, D. et al., "Nanodipole Photovoltaics," Applied Physics Letters, 2008, vol. 92, No. 1.

Tyan, Y. et al., "A Simple Scheme for the Minimization of the Impact of Shorting Detects in Large-Area Thin-Film Integrated Arrays," Proc. 17th IEEE PVSC, 1983, Orlando, Florida.

* cited by examiner

SYSTEM FOR SELECTIVELY FILLING PIN HOLES, WEAK SHUNTS AND/OR SCRIBE LINES IN PHOTOVOLTAIC DEVICES AND PHOTOVOLTAIC CELLS MADE THEREBY

CROSS-REFERENCE TO RELATED APPLICATIONS AND STATEMENT REGARDING SPONSORED RESEARCH

The present invention claims the benefit of the provisional patent application Ser. No. 61/072,258 filed Mar. 28, 2008. This invention was not made with government support and the government has no rights in this invention.

BACKGROUND OF THE INVENTION

There is no admission that the background art disclosed in this section legally constitutes prior art.

During the fabrication of photovoltaics devices undesirable and detrimental defects are sometimes formed. These defects sometimes extend through one or more of the layers of the photovoltaic device. When an electrode layer is applied to the photovoltaic device being formed, an electrical contact can be created between the metal electrode and the transparent electrode. This undesired electrical contact that occurs due to the presence of the defect is often referred to as a "shunt", a "pin hole" or a "weak diode". The presence of defects decreases or destroys the photovoltaic properties of the photovoltaic device.

In addition, in the fabrication of certain photovoltaics, a scribe line is formed through at least a portion of an outer layer thereof. It is sometimes desirable to fill in at least portions of the scribe line in order to prevent or minimize any undesired electric contact through such scribe lines.

There is a need for a method to reduce the detrimental effects of defects that cause undesirable electrical contact in photovoltaic devices and/or to fill in specific portions of the scribe lines in the photovoltaic devices.

SUMMARY OF THE INVENTION

In a broad aspect, there is provided a method of making a photovoltaic cell comprising at least partially filling one or more areas of a layer of the photovoltaic cell where electrical current is to be substantially prevented from flowing. The method includes electrically isolating at least the outer layer of the photovoltaic device from other layers of the photovoltaic device.

In another broad aspect, there is provided herein a photovoltaic cell, comprising at least one electrode layer and at least one outer layer, the outer layer having one or more areas in which electrical current is to be prevented from flowing therethrough, wherein said areas are at least partially filled with a protective material that is at least partially polymerized.

In another broad aspect, there is provided herein a system for generating electrical energy comprising a multilayered photovoltaic cell as described herein.

In still another broad aspect, there is provided herein a system for generating electrical energy comprising a multi-layered photovoltaic cell, the photovoltaic cell including a photovoltaic device having one or more pin holes, weak shunts and scribe lines in at least an outer layer thereof, and an insulating material at least partially filling such pin hole, weak shunt and/or scribe line.

Various objects and advantages of this invention will become apparent to those skilled in the art from the following detailed description of the preferred embodiment, when read in light of the accompanying drawings.

BRIEF DESCRIPTION OF THE FIGURES

Exemplary features that are characteristic of the present invention are set forth with particularity in the appended Claims. Exemplary embodiments of the invention, as to structure and method of manufacture and use, will best be understood from the accompanying description of specific embodiments when read in conjunction with the Figures, as follows.

DETAILED DESCRIPTION OF THE PREFERRED EMBODIMENT(S)

Figures 1A, 1B, 1C:
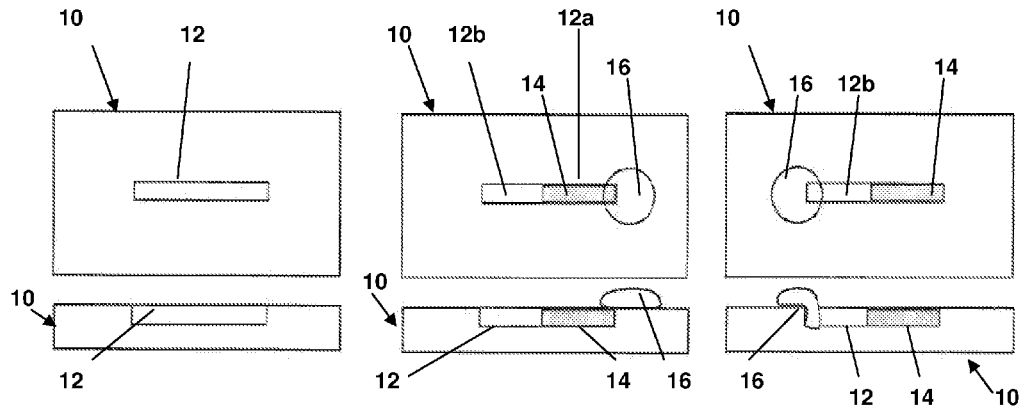
FIGS. 1A-1C are schematic illustrations of one embodiment of a method for filling pin holes, weak shunts and/or scribe lines of photovoltaic devices.

In a first aspect, there is provided herein a method of making a photovoltaic cell where an unfinished photovoltaic cell has at least one electrode layer and at least one outer layer. The outer layer typically has one or more areas in which electrical current is to be prevented from flowing therethrough. The method includes at least partially filling one or more of such areas with a protective material, and causing at least a partial polymerization of the protective material present in such areas.

In certain embodiments, the method further includes causing substantially complete polymerization of the protective material in said areas.

In certain embodiments, at least partial polymerization occurs by applying an electric current to the electrode sufficient for the protective material to at least partially polymerize in such areas in the outer layer.

In certain embodiments, the method further includes controlling a thickness of the protective material being formed in such areas by controlling the amount of current allowed to pass through the electrode.

In certain other embodiments, the at least partial polymerization occurs by applying light energy to the outer layer sufficient for the protective material to at least partially polymerize in said areas in the outer layer.

In certain embodiments, the method further includes depositing the protective material on exposed portions of the electrode, and applying energy to the electrode sufficient to cause the at least partial polymerization of the protective material when the protective material contacts the electrode.

In certain embodiments, the method further includes at least partially filling such area by at least partially coating the outer layer with the protective material. In certain embodiments, the outer layer is at least partially submerged in the protective material.

In certain embodiments, the protective material is a weakly conductive material. In certain other embodiments, the protective material is an insulating material.

In certain embodiments, the protective material comprises mixture of a monomer material and a supporting electrolyte. In certain embodiments, the mixture comprises a monomer capable of undergoing electro-chemical polymerization.

Non-limiting examples of suitable monomers include phenols, anilines, pyrroles, thiophenes, fluorenes and phenylene vinylenes.

In certain other embodiments, the mixture comprises a monomer capable of undergoing photo-induced polymerization. Non-limiting examples of such suitable monomers include methyl methacrylates, cycloaliphatic epoxides, acrylamides and styrenes.

In certain embodiments, such areas comprise one or more of holes, weak shunts and/or scribe lines in the outer layer.

In certain embodiments, the method further includes applying a second electrode to the photovoltaic device.

In another broad aspect, there is provided herein a method of manufacturing a photovoltaic cell comprising: providing a substrate; placing a first electrode on the substrate; placing an outer layer on the first electrode, the semiconductor having an outer surface; and, depositing an insulating material for a period of time sufficient for the insulating material to at least partially fill any holes, weak shunts and/or scribe lines in the outer layer.

In another broad aspect, there is provided herein a photovoltaic cell formed by the method described herein.

In particular, the method is useful to selectively fill one or more holes and/or weak shunts that are sometimes formed during the fabrication of the different layers of photovoltaics devices.

The method is also useful to fill at least certain desired areas of scribe lines in photovoltaic devices. It is to be understood that the present method described herein is useful for more than filling in pin holes in photovoltaic devices. The following detailed explanation is directed to the filling of pin holes, weak shunts, and scribe lines for ease of explanation and illustration. In the following general explanation, it is to be understood that the terms "areas" or "holes" can be understood to mean any defect or area on the photovoltaic device (including, for example, an area such as a scribe line) where it is desired that no, or minimal, current be allowed to pass therethrough.

Likewise, in certain embodiments, the present method includes the use of one or more protective materials, such as monomers which undergo polymerization. It is to be understood that the terms "polymer," "protective material" and "insulating material" generally refer to materials that, upon completion of the method described herein, are at least partially polymerized.

In certain other embodiments, the method described includes the use of an exposed electrode to initiate polymerization of an insulator protective material onto the electrode. The presence of the protective material on the first electrode thereby prevents contact between the first electrode and a subsequently applied second electrode. Also, the method can include the use of photoactive polymerization to at least partially coat the exposed electrode with an insulator material prior to depositing the second electrode.

The polymerization can be initiated at points where the semiconductor is very thin and polymerization of an insulator might occur onto the point where the semiconductor is very thin. In certain embodiments, there is at least partial polymerization that occurs prior to the deposition of the second electrode. In other embodiments, the polymerization is substantially completed prior to the deposition of the second electrode.

Also, an insulating material can be formed prior to deposition of the last electrode to prevent electrical contact between the two electrodes.

Also described herein is a photovoltaic device that includes an electrochemically-initiated polymerized insulator on a completed module. In certain embodiments, this is especially advantageous since a back side of a PV module can be sealed Plexiglas™ type of material. In such embodiments, EVA and glass are not needed and the cost of a module can be reduced significantly.

In a particular aspect, the method includes selectively filling any holes with an insulator material or with a material of poor electrical conductivity. After the hole is selectively filled, a metal electrode can be applied to the layered photovoltaics device being formed. The insulating material filling the holes prevents electrical contacting between the metal and the transparent electrodes of the layered photovoltaics device being formed.

In one embodiment, the fabrication of a photovoltaics device proceeds in a generally accepted manner until the step wherein a final electrode is applied to the photovoltaic device.

For example, in an embodiment that comprises a CdS/CdTe device on glass, the photovoltaics device at this point could consist of the following layers: glass/TCO/CdS/CdTe where all post-deposition steps have been applied. At this point in the formation process, the photovoltaic device may generally contain holes that expose part of the TCO layer. If the hole is present during a process when an electrode is applied, a shunt is created between the TCO and the electrodes.

Therefore, in a particular aspect, the present invention includes a "blocking" or "filling" step prior to adding a metal electrode to the photovoltaic device being formed. The filling step generally includes applying a filling material in at least an outer layer of the unfinished photovoltaic device. In certain embodiments, the holes are at least partially filled with an insulating material or other suitable material that has poor electrical conductivity. In one embodiment, the filling material is at least partially polymerized by electrochemical-induced polymerization. In another embodiment, the filling material is at least partially polymerized by photo-induced polymerization.

In the electrochemical polymerization method, an unfinished photovoltaics device having at least one electrode is immersed in a solution of a suitable monomer insulating material and a suitable supporting electrolyte. A low potential is applied to the electrode. The electrode that is exposed to the solution is charged. When the monomer insulating material contacts the charged electrode, a polymerization reaction occurs. In this embodiment, a polymer insulating material having poor electrical conductivity is formed within the holes of the unfinished photovoltaics device.

In certain embodiments, the polymerization can generally start from the exposed surface of the electrode first, thus providing good blocking and insulating as soon as the polymerization process begins. The continued application of the low potential charge increases the polymerization of the monomer insulating material at increasing distances from the exposed electrode surface of the unfinished photovoltaic device.

Also, in certain embodiments, the thickness of the polymer being formed during the polymerization reaction can be controlled by varying the amount of current allowed to pass. In such embodiments, the amount of polymerized material in the hole can be controlled.

After treatment of the unfinished photovoltaic device with the polymerization step, a final electrode is applied. The insulating material in the holes substantially prevents the final electrode from making electrical contact with the other electrode such that shunts cannot occur.

In one example, a one-by-three inch glass/TCO/HRT/CdS/CdTe unfinished photovoltaic device sample was physically scribed with a one cm line in the center of the sample. The sample then was immersed in an aqueous solution of aniline insulating material and sodium chloride such that one half of the scribed line was exposed to the solution. The TCO (connected to a potentiostat) was brought to 0.4 volts for fifteen minutes. The sample was removed, rinsed with water and dried. Inside the scribe line, which had been exposed to the monomer solution, a 2000 Å coating of insulating material was formed. When a metal electrode was applied to the end of the scribe line that was partially filled with the polymer insulating material, the sample was not shunted. Rather, a photovoltage of circa 700 mV and a photocurrent of circa 19 mA/cm was obtained, which compares favorably with metal dots away from the scribe line. In contrast, when a metal contact was applied to the end of the scribe line, which had not been exposed to the monomer solution, the metal dot was shunted, and a photovoltage of circa 50 mV was obtained.

FIGS. 1A-1C are schematic illustrations showing the filling of a scribe line in a sample of CdS/CdTe photovoltaic. FIG. 1A shows a CdS/CdTe device 10 having a scribe line 12 in a top plan view (upper) and a side elevation view (lower). FIG. 1B shows a CdS/CdTe device 10 where one half 12a of a scribe line 12 was filled with an insulating material 14 in a top plan view (upper) and a side elevation view (lower) where no shunt was formed. FIG. 1C shows a CdS/CdTe device where one half 12b of the scribe line 12 is not filled with any insulating material in a top plan view (upper) and a side elevation view (lower), and where a shunt 16 is formed that extends into the device 10.

Figures 2A, 2B:
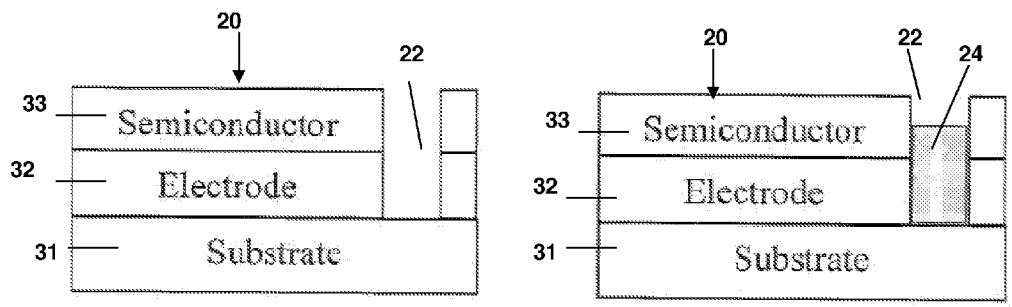
FIGS. 2A-2B are schematic illustrations of another embodiment of a method for filling pin holes, weak shunts and/or scribe lines of photovoltaic devices.

In another embodiment, the method is useful for the filling of an isolation scribe line. FIGS. 2A and 2B schematically illustrate a photovoltaic device 20 as having a substrate layer 31, an electrode 32 and a semiconductor 33. The photovoltaic device 20 also has an isolation scribe line 22. In FIG. 2B, at least a portion of the isolation scribe line 22 is filled with an insulating material 24.

Figures 3A, 3B:
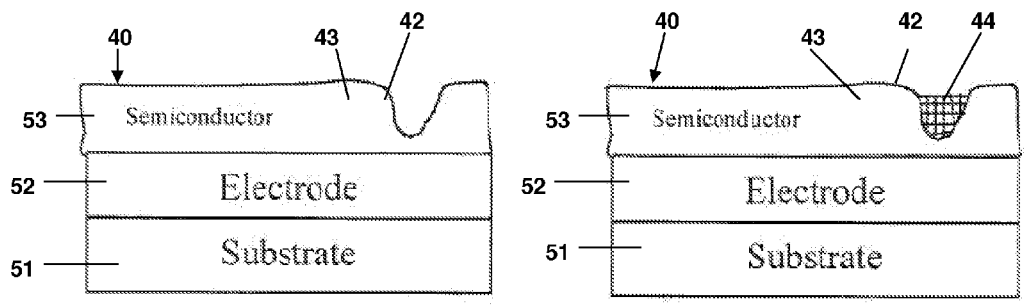
FIGS. 3A-3B are schematic illustrations of still another embodiment of a method for filling pin holes, weak shunts and/or scribe lines of photovoltaic devices.

In yet another embodiment, the method is useful to reduce the adverse effects of a weak shunt that can occur when a semiconductor layer is thin, but not to the point of exposing the underlining electrode material. FIGS. 3A and 3B schematically illustrate a photovoltaic device 40 as having a substrate layer 51, an electrode 52 and a semiconductor 53. The semiconductor layer 53 can sometimes be formed with a region 42 that is thinner than adjacent regions 43. In FIG. 3B, the thinner region 42 is at least partially filled with an insulating material 44.

When the electrode layer 52 is contacted to a potentiostat (not shown) and charged to a low potential, at least the surface of the region 43 of thin semiconductor 53 may become charged. As the insulating material 44 makes contact with the charged surface, a polymerization reaction occurs at that point on the surface, leaving the thin region 42 at least partially covered with a thin layer of insulating material 44.

In another aspect, there is provided herein a method for filling pinholes, thin portions of semiconductor and isolation scribes that is especially very useful for those photovoltaics devices where a metal electrode is placed on a substrate (such as glass or polymer) and photo-induced procedures are not a viable approach to treat the photovoltaic devices. In such embodiments, the method described herein is especially useful to fill any defects prior to a final deposition of an electrode material.

In yet another aspect, there is described herein a method for curing defects and the like which includes a photo-induced polymerization of the insulating material. In one embodiment, the unfinished photovoltaics device is immersed in a solution of monomer insulating material and photosensitizer. Light is passed through a glass (or otherwise transparent) side of the photovoltaic device to induce a polymerization reaction. The polymer insulating material at least partially fills the holes, thin regions of semiconductor and/or isolation scribe lines.

In still another aspect, there is provided herein a method which includes a low temperature encapsulation of a finished photovoltaics device. In one embodiment, an electrochemical-induced or photo-induced polymerization process can be used to seal an exposed portion of the photovoltaic device from exposure to the elements. This sealing process can be done prior to a final encapsulation step in the production of photovoltaic modules. Further, in certain embodiment, the sealing process can act as the final encapsulation, which can then lead to considerable lowering of the weight of the fabricated module.

The methods described herein can be used on any type of photovoltaic devices. Non-limiting examples include: Si, a-Si, GaAs-based, CdTe-based, CIS-based, $TiO_2$-based, nanoparticle-based, and others. In addition, both substrate, as well as superstrate configurations, can be enhanced by these methods.

In particular embodiments, useful protective materials can include any monomer known to be useful for either electrochemical-induced polymerization (such as aniline, pyrrole, thiophene, and others) or for photo-induced polymerization (for example, methyl methacrylate that is used to prepare such materials as Plexiglas®) can be used.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A method of making a photovoltaic cell, wherein an unfinished photovoltaic cell has at least one electrode layer and at least one outer layer, the outer layer having one or more selective areas in which electrical current is to be prevented from flowing therethrough, the method comprising:
    exposing the outer layer to a protective material,
    applying a current to the outer layer such that said selective areas become charged, the current being sufficient to at least partially polymerize the protective material in said charged selective areas in the outer layer, and to at least partially fill one or more said selective areas of the outer layer with a protective material, and
    causing at least a partial polymerization of the protective material present in said selective areas, while not causing at least a partial polymerization of the protective material in remaining areas not defined by said selective areas of the outer layer.

2. The method of claim 1, further including causing substantially complete polymerization of the protective material in said selective areas.

3. The method of claim 1, further including controlling a thickness of the protective material in said selective areas by controlling the amount of current allowed to pass through the electrode.

4. The method of claim 1, wherein the at least partial polymerization is further aided by applying light energy to the outer layer sufficient for the protective material to at least partially polymerize in said selective areas in the outer layer.

5. The method of claim 1, wherein the protective material comprises a mixture of a monomer material and a supporting electrolyte.

6. The method of claim 5, wherein the monomer comprises one or more of: phenols, anilines, pyrroles, thiophenes, fluorenes and phenylene vinylenes.

7. The method of claim 1, wherein said selective areas comprise one or more of holes, weak shunts and/or scribe lines in the outer layer.

8. The method of claim 1, wherein the protective material comprises pyrroles.

9. A method of manufacturing a photovoltaic cell comprising:
 providing a substrate;
 placing a first electrode on the substrate,
 placing an outer layer on the first electrode, the outer layer having an outer surface;
 exposing the outer layer to a protective material,
 applying a current to the outer layer such that said selective areas become charged, the current being sufficient to at least partially polymerize the protective material in said selective areas in the outer layer, for a period of time sufficient for the protective material to at least partially fill any holes, weak shunts and/or scribe lines in the outer layer;
 whereupon, exposure of the protective material to said selective areas in the outer layer initiates a polymerization reaction of the protective material in said selective areas;
 causing at least a partial polymerization of the protective material present in said selective areas, while not causing at least a partial polymerization of the protective material in remaining areas not defined by said selective areas of the outer layer; and
 depositing a second electrode on the outer layer, wherein the protective material substantially prevents electrical contact between the first electrode and the second electrode.

10. The method of claim 9, wherein the protective material comprises pyrroles.

11. A photovoltaic cell, comprising at least one electrode layer and at least one outer layer, the outer layer having one or more selective areas in which electrical current is to be prevented from flowing therethrough,
 wherein said selective areas are at least partially filled with a protective material that is at least partially polymerized by the application of a current to the one or more selective areas of outer layer sufficient to at least partially polymerize the protective material in said selective areas in the outer layer, and
 wherein a remaining outer surface not defined by said selective areas of the outer layer does not have at least a partial polymerization of the protective material.

12. The photovoltaic cell of claim 11, wherein said selective areas comprise one or more of pin holes, weak shunts and scribe lines in the outer layer.

13. The method of claim 11, wherein the protective material comprises pyrroles.

14. A photovoltaic cell formed by the method of claim 1.

15. A photovoltaic cell formed by the method of claim 9.

16. A system for generating electrical energy comprising a photovoltaic cell of claim 1.

17. A system for generating electrical energy comprising a photovoltaic cell of claim 9.

\* \* \* \* \*